United States Patent

Sigmon

[15] 3,644,843

[45] Feb. 22, 1972

[54] TEMPERATURE STABLE NEGATIVE RESISTANCE DIODE COAXIAL CAVITY ENERGY CONVERTER OPERATING IN AN ANTIRESONANT MODE

[72] Inventor: Bernard E. Sigmon, Tampa, Fla.

[73] Assignee: Sperry Rand Corporation

[22] Filed: June 22, 1970

[21] Appl. No.: 49,437

[52] U.S. Cl. ....................331/101, 330/34, 330/56, 331/107 R, 331/107 G, 331/107 T, 333/82 B

[51] Int. Cl. ....................H03b 7/14, H03f 3/10

[58] Field of Search ....................331/96, 97, 101, 102, 107 R, 331/107 G, 107 T, 117 D; 333/82 B; 330/5, 34, 56, 61 A

[56] References Cited

UNITED STATES PATENTS

| | | | |
|---|---|---|---|
| 3,278,859 | 10/1966 | Gregory | 331/101 X |
| 3,231,831 | 1/1966 | Hines | 331/96 |
| 3,533,017 | 10/1970 | Scherer | 331/107 |

OTHER PUBLICATIONS

Dalman, " A Coupled- Cavity Avalanche Diode X- Band Oscillator," The Microwave Journal, March 1968, pp. 32, 34.
Frey et al. " Influence of Second- Harmonic Frequency Termination On Gunn- Oscillator Performance," 27 Dec. 1969, pp. 691- 693.

*Primary Examiner*—John Kominski
*Assistant Examiner*—Siegfried H. Grimm
*Attorney*—S. C. Yeaton

[57] ABSTRACT

A semiconductor diode coaxial line energy converter operable as a single port, high-frequency amplifier or oscillator has enhanced temperature stability and operating power output level through employment of a coaxial cavity resonator structure working in an antiresonant mode and having means for increasing the effective junction capacitance of the active diode.

4 Claims, 4 Drawing Figures

PATENTED FEB 22 1972 3,644,843

INVENTOR
BERNARD E. SIGMON
BY
H P Terry
ATTORNEY

TEMPERATURE STABLE NEGATIVE RESISTANCE DIODE COAXIAL CAVITY ENERGY CONVERTER OPERATING IN AN ANTIRESONANT MODE

The invention herein described was made in the course of or under a contract or subcontract thereunder with the United States Air Force.

BACKGROUND OF THE INVENTION

1. Field of the Invention

The invention pertains to means for generation or amplification of stable high frequency oscillations within hollow cavity resonators and more particularly to the efficient generation or amplification of such stable high frequency signals under varying temperature conditions by the use of active semiconductor elements exhibiting negative resistance characteristics.

2. Description of the Prior Art

A design often encountered in coaxial cavity semiconductor diode amplifiers and oscillators is that for which the packaged diode in its mount forms a resonant circuit, a design requiring that the cavity have a line length of one-half wavelength or multiples thereof at the frequency of operation. Such microwave energy converters generally demonstrate serious lack of frequency stability under changing ambient temperature conditions because of the inherent characteristics, for example, of available semiconductor diodes employed therein. It has been determined that such frequency instability is primarily due to the fact that semiconductor diode junction capacitance changes significantly with temperature.

Prior art high frequency energy converter designs also have relatively restricted power output capabilities because of limitations imposed on semiconductor diodes used in resonant mode operations of such microwave energy converters. Small surface area semiconductor diodes have been employed with consequent limitation of power dissipation within the diodes themselves to prevent burn out of diodes due to excessive diode junction temperature.

SUMMARY OF THE INVENTION

The present invention concerns an active negative resistance semiconductor diode energy converter circuit which operates efficiently as a temperature stable oscillator or amplifier of microwave energy. The improved active microwave device includes a hollow cavity resonator of the coaxial line type within which is coupled a semiconductor diode biased by an external potential supply means so as to exhibit negative resistance characteristics. The diode is located between a modified wall of the cavity and the coaxial inner conductor of the cavity. The inner conductor is extended to a second wall of the cavity, the extension serving also as an aid in supplying of the biasing electric field across the semiconductor diode. The coaxial line energy converter has enhanced temperature stability and provides increased operating power output through use of antiresonant mode operation of the coaxial line resonant cavity and of means for increasing the junction capacity and power handling capability of the diode.

DESCRIPTION OF THE PREFERRED EMBODIMENT

Figures 1, 2, 3, 4:
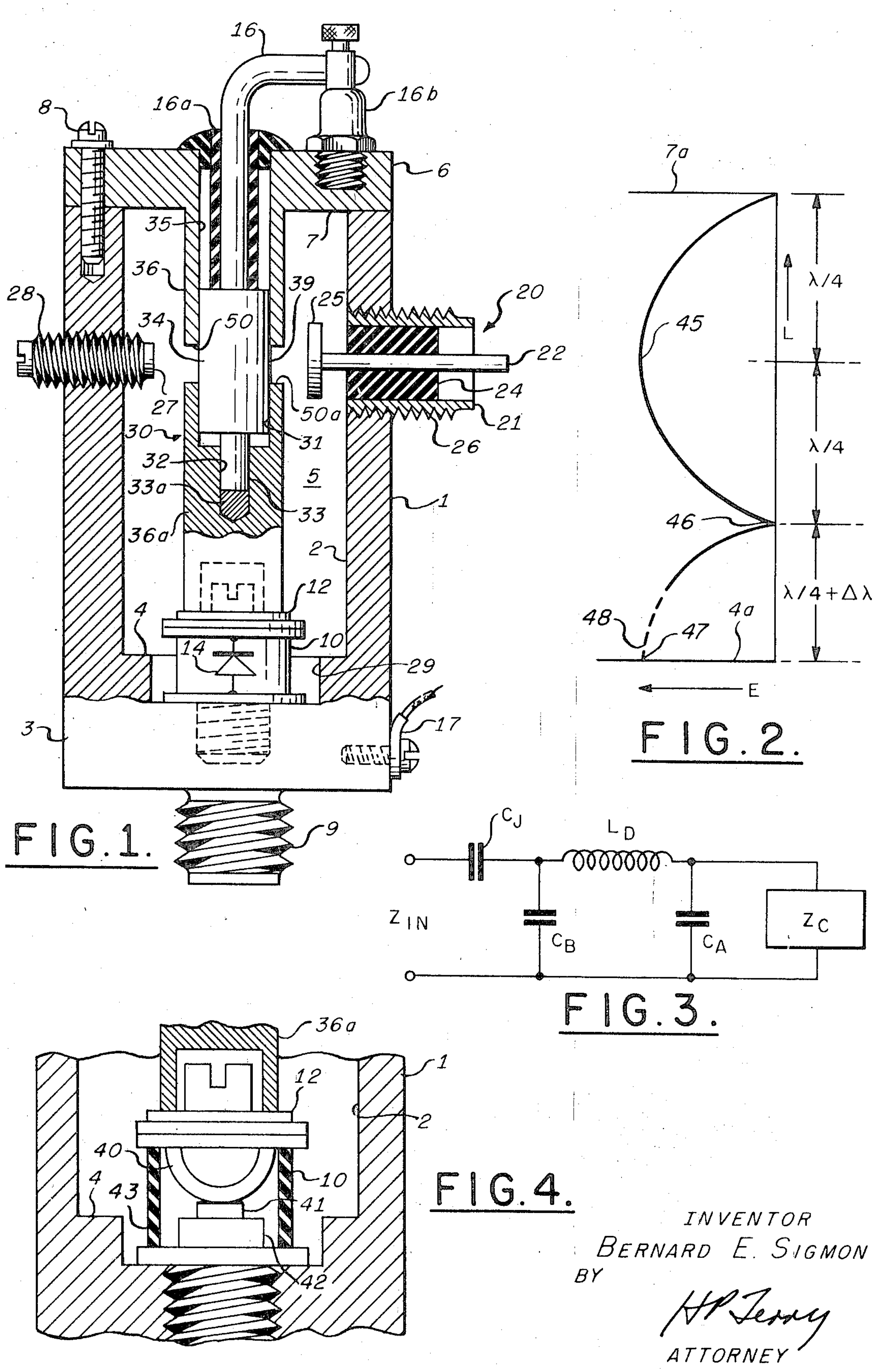
FIG. 1 is an elevation view partly in cross section of a preferred embodiment of the invention.
FIG. 2 is a graph for explaining the character of the oscillating electric fields within the apparatus of FIG. 1.
FIG. 3 is a simplified equivalent circuit of the apparatus of FIG. 1.
FIG. 4 is a fragmentary cross section view showing greater detail of a portion of FIG. 1.

FIG. 1 illustrates a preferred form of the temperature-stable microwave energy converter. The embodiment is in the form of a hollow coaxial line cavity resonator semiconductor diode oscillator or amplifier employing means for temperature stable operation. In the figure, cavity resonator 5 is bounded by a cylindrical tubular wall 1 made of material of good conductivity for high-frequency currents and having a circularly cylindric interior surface 2 thus presenting good electrical conductivity characteristics at the operating high frequency. One end of cavity 5 is closed by a flat wall 3; wall 3 may be formed integrally with wall 1 and has adjacent the interior of cavity 5 a surface 4 also of good high frequency electrical conductivity.

Opposite wall 3, cavity 5 is further defined by a flat wall or disk 6, whose interior surface 7 also has good electrical conductivity, especially wherever adjacent cavity 5. Wall or plate 6 is not formed integrally with cylindrical wall 1, but is, for convenience, a physically discrete part. Wall 1 and wall 6 may be bound together by any suitable known means, such as by cementing, or by a set of screws such as screw 8.

Stud 9 on the exterior of wall 3 is provided with threads so that the resonant cavity may be firmly attached to a suitable baseplate or chassis element (not shown). Not only does stud 9 provide means for mounting the described elements, but it also serves to provide a heat conducting path so as to prevent undue rise of temperature of the active diode junction caused by internal bias direct current input power losses.

Surface 4 of wall 3 of cavity resonator 5 is connected to the opposed surface 7 of wall 6 by further elements of the resonant cavity circuit, including active semiconductor or diode element 10 and a composite inner high frequency current conductor 30. The cylindrical surfaces of parts 36 and **36*a* of composite conductor 30 have low ohmic loss characteristics at the operating high frequency, similar to those of wall surfaces 2, 4, and 7**.

Semiconductor diode 10 is a commercially available microwave diode, for example, of the avalanche transit time type, although microwave diodes operating according to other energy converting mechanisms may be substituted, such as Gunn or tunnel diodes. Diode 10 is shown in full view and, for ease in understanding its relation to its associated elements, a schematic indication 14 of its polarization is illustrated as if it were actually printed on the cylindrical outer surface of diode 10. The function of diode 10 and its relation to composite inner conductor 30 remains to be discussed in greater detail.

For the purpose of abstracting high frequency energy from cavity 5, an output transmission line 20 may be provided. Line 20 may be, for example, a coaxial transmission line, having the usual inner conductor 22 and a tubular outer conductor 21. As is normal practice, inner conductor 22 is conveniently supported in concentric relation within outer conductor 21 by an apertured bead 24 of dielectric material having very low electrical loss characteristics at the operating frequency. The outer surface of outer conductor 21 is provided with threads 26 whereby it is fastened within a threaded hole passing through wall 1; also, threads 26 provide a convenient means for coupling an external transmission line (not shown) between the energy converter output and utilization apparatus. It will be evident to those skilled in the art that the single port energy converter may be used as an amplifier in the conventional manner by attaching a three port circulator device to transmission line 20.

Outer conductor 21 and bead 24 may end at surface 2 of wall 1 with a flat surface or a rounded end surface conforming to the shape of cylindrical surface 2. However, inner conductor 22 extends into cavity 5 for the purpose of supporting a round capacitive coupling disk or plate 25 within cavity 5 adjacent composite conductor 30. Inner conductor 22 and thus capacitive disk 25 are located in a plane of high oscillating electric field strength within resonator 5. Alternatively, other known coupling means for extracting energy from the oscillating high frequency field in cavity 5 may be employed. A capacitive tuner element 28 is located in wall 1 directly opposite disk or plate 25 and is also centered substantially in the plane of the center of disk 25.

Tuner element 28 is a simple screw made preferably of the same good electrically conducting material as surfaces 2 and 4, for example. As seen in FIG. 1, it is mounted on a threaded hole in wall 1 with its central axis substantially in the plane of the center of disk 25. Its inner face 27 is thus adjacent composite conductor 30 where it interacts in substantially a conventional manner with the oscillating electric fields in the vicinity of conductor 30 to provide the desired tuning effect. Frequency adjustment is accomplished by simple rotation of screw 28 which translates face 27 relative to wall 2 and relative to conductor 30. Other known tuning mechanism may be substituted for tuner screw 28. Means may also be provided, as is well known in the art, for restricting the spatial field pattern within the coaxial cavity to the particular desired pattern to the exclusion of undesired field patterns.

As noted previously, a composite inner conductor 30 spans the cavity resonator 5 at its axis of symmetry; it consists of the active diode 10, a high frequency conductive rod 36*a*, a cylindrical resistor element 34, and a high frequency conductive tube 36, all in series relation. It will be seen that the parts of composite inner conductor 30 are arranged in such a manner that composite conductor 30 performs several important functions compatibly.

The active diode 10 is conductively affixed to the center of wall 3 and is, in turn, similarly conductively affixed at junction 12 to high frequency conductive rod 36*a*. These bonds may be made by low temperature soldering or by the use of certain conductive cements readily available on the market. On the other hand, the fixed conductive relation may be established by threads attached to ends of the diode 10 package which mate with suitable threaded holes in rod 36*a* and wall 3, as is conventional practice.

At the face 50*a* at the end of rod 36*a* remote from diode 10, there is supplied an axial bore 31 somewhat smaller in diameter than the outer diameter of rod 36*a*. The inner end of the bore 31 is supplied with a relatively smaller diameter axial bore 32. Resistor 34 is a commonly available resistor having a thin insulating cylindrical surface and of diameter substantially equal to that of bore 31. A first lead 33 of resistor 34 is inserted in the small bore 32 and is soldered at 33*a* or otherwise conductively fastened therein so as to expose above rod 36*a* a limited portion of the cylindrical surface 39 of resistor 34 to the high frequency fields found within cavity resonator 5.

Tube 36 is equipped with a bore or inner wall 35 of diameter such that its face 50 is readily slipped over a portion of the cylindrical surface of resistor 34. A second electrical lead 16 of resistor 34 is brought entirely out of the cavity system through tube 36. Glass tube 16*a* insulates lead 16 from wall 35. Tube 36 is made integral with end wall 6 and is supported thereby.

One role of the composite inner conductor 30 is to supply an appropriate bias voltage to active diode 10 through resistor 34 from an external source (not shown) attached via insulated terminal 16*b* to lead 16 and also to terminal 17. Resistor 34 is a standard carbon resistor of the type commonly employed in relatively low frequency lumped constant circuits. It may nominally have a ⅛- or ¼-watt dissipation characteristic; its resistance value is experimentally determined according to the particular operating frequency and the type of diode 10. A safe minimum resistance value is selected to avoid excessive internal heating of the structure, since bias current for diode 10 must flow through resistor 34. A 50-ohm resistor has been used in certain forms of the invention.

While other means may be used for the purpose, a further function of the composite inner conductor 30 lies in substantially limiting the number of possible oscillating field modes within cavity 5 to a single desired field mode pattern. The cylindrical surface 39 of resistor 34 exposed between the respective faces 50 and 50*a* of tube 36 and rod 36*a* performs such a function. The operation of resistor 34 in removing undesired signals from the oscillator output is to absorb energy in undesired modes to the extent that oscillations in such modes are substantially never sustained. At the desired operating frequency, no high frequency currents flow to and from the exposed surface of tube 36 across surface 39 of resistor 34 to and from the exposed surface of rod 36*a*. Thus, the exposed resistive surface 39 carries no high frequency current corresponding to the desired frequency. Experiencing no losses, the desired frequency signal strength grows, being efficiently amplified by the amplification mechanism of diode 10.

Signals having undesired space or frequency modes of oscillation cannot build up in amplitude, since each such mode would cause currents to flow along face 39 of resistor 34. Such modes would cause currents to penetrate into face 39 to the usual skin depth, whereby the undesired energy would be converted into heat. Resistor 34 is thus involved within the microwave cavity resonator circuit in such a way as to suppress undesired modes without having any substantial effect on the efficient production of stable desired oscillations. The undesired mode-suppressing means is incorporated directly within the microwave circuit in such a manner as to be effectively compatible therewith, i.e., the novel microwave circuit has natural geometrical and other characteristics permitting the direct incorporation of a simple resistor for suppressing undesired modes and preventing unstable and inefficient operation, while simultaneously supplying bias current to diode 10. An ancillary role of composite conductor 30 is to conduct heat produced by ohmic losses caused by bias current flow, as well as heat generated by undesired mode absorption, directly to the external surfaces of cavity resonator 5.

According to the invention, the frequency stability characteristics with changing temperature are improved by means now to be discussed. First, the coaxial converter device of FIG. 1 is arranged to operate in a TEM antiresonant mode, for example, such as the mode illustrated in the graph of FIG. 2. In what follows, it should be clear that other antiresonant modes may be also used. In FIG. 2, the ordinate lines 4*a* and 7*a* correspond to the barriers formed in cavity resonator 5 by the conducting surfaces 4 and 7 respectively. FIG. 2 is intended qualitatively to show the behavior along composite conductor 30 of the high frequency radial electric field between conductor 30 and wall 2. For example, it falls in the particular antiresonant mode illustrated to zero at 7*a* in the plane of surface 7 of cavity 5 and rises to a maximum value at point 45 in the plane selected for insertion of output coaxial line 20 and tuner 28. The oscillating electric field again falls to zero at point 46 in the illustrated antiresonant mode, a point about halfway between tuner 28 and surface 4. The electric field rises again substantially to the same maximum value as at point 45 near surface 4, though in that region 48, it is not readily illustrated by theoretical derivation. Such is not significant, however, in explaining the operation of the present invention. It is seen that points 7*a* and 45 and 46 are substantially one-quarter wave apart, while points 46 and 47 are separated by a distance about $\lambda/4$. The parameter $\lambda$ is the operating wavelength of the carrier wave.

For providing relatively high-power operation of the converter of FIG. 1, it is seen to be desirable that the junction capacitance $C_J$ of diode 10 be large in value. The value of $C_J$ may be increased by use of a diode 10 designed to have a large junction area. A large value of that area and thus of $C_J$ permits higher power dissipation in the diode without destruction due to overheating. Higher bias currents may also be used, thus permitting higher microwave frequency power output levels.

Furthermore, it is found that high-frequency antiresonant mode operation of the device of FIG. 1 is best effected by sinking diode 10 into a well or counterbore 29 in a central location in wall 3. The sides of well or counterbore 29, being intimately associated with the diode 10 package, permit an increase in the value of $C_A$, the effective diode package capacitance. In these statements, it is assumed that the oscillator has a high quality factor Q and thus the frequency determining elements are the reactive elements. Also, it is assumed that the reactive effects due to fringing capacitance $C_H$ between the diode's internal contact lead 40 (FIG. 4) and its mounting are very high at the operating frequency and can therefore be ignored. FIG. 4 represents such a commercial diode package with an enclosure 43 and with a base element 42, silicon chip diode 41, and contact lead 40.

Under such circumstances, the lumped constant circuit of FIG. 3 appears to be one possible representation of the oscillation circuit. In FIGS. 3 and 4, $C_A$, $C_B$, and $C_J$ are as previously defined, while:

$Z_C$ = impedance of the coaxial cavity, $L_D$ = diode contact lead inductance, and $T$ = temperature.

For the selected antiresonance state, $Z_C$ approaches infinity, and $Z_{IN}$, the input impedance of the circuit, becomes:

$$Z_{IN} = \left(\frac{1}{j\omega C_J} + j\omega L_D + \frac{1}{j\omega C_A}\right) \quad (1)$$

For $Z_{IN}=0$; i.e., the steady state oscillating condition at a given temperature $T_1$:

$$\omega_1 = \frac{1}{\sqrt{L_D}} \sqrt{\frac{C_A + C_J}{C_A C_J}} \quad (2)$$

At temperature $T_2$:

$$\omega_2 = \frac{\sqrt{(C_A + C_J)\left(1 + \frac{\Delta C_J}{C_A + C_J}\right)}}{\sqrt{(L_D C_A C_J)\left(1 + \frac{\Delta C_J}{C_J}\right)}} \quad (3)$$

where $\Delta C_J$ is the corresponding incremental change in $C_J$ with temperature. From equations 2 and 3:

$$\frac{\Delta\omega}{\omega_1} = k\left(\frac{C_A}{C_A + C_J}\right) \quad (4)$$

where $k$ includes various of the constant parameters of equations 2 and 3. If $C_A$ approaches zero, then the ratio $\Delta\omega/\omega_1$ approaches zero; thus, by the judicious choice of the values of $C_A$ and $C_J$, temperature stability is enhanced. Large values of $C_J$ permit correspondingly large temperature stability, as well as operation at correspondingly higher power levels.

For example, data was taken experimentally for a tellurium-copper coaxial cavity avalanche diode oscillator such as that of FIG. 1 operating in the antiresonant conditions for various temperatures. The data was taken for two different avalanche diodes, one operating at 16 GHz. and the other at 18 GHz. The frequency versus temperature stability characteristic in both cases was approximately 12 parts per million per degree centigrade. In contrast, typical frequency versus temperature characteristics for resonance mode operation are greater than 50 parts per million per degree centigrade.

While the invention has been described in its preferred embodiments, it is to be understood that the words which have been used are words of description rather than of limitation and that changes within the purview of the appended claims may be made without departure from the true scope and spirit of the invention in its broader aspects.

I claim:

1. High-frequency energy converter means comprising:
coaxial line resonator means having first and second opposed interior conductive surface means and adapted to be excited by an antiresonant TEM mode-oscillating electromagnetic field,
said first interior conductive surface means having centrally located recess means closed by recessed conducting surface means,
negative resistance semiconductor diode means,
said semiconductor diode means being conductively coupled to said recessed surface means for increasing the effective junction capacitance of said semiconductor diode means,
bias circuit means,
said bias circuit means extending through said second opposed interior conducting surface means and being conductively coupled to said semiconductor diode means for providing a bias electrical field thereacross, and
coupling means in high frequency energy translating relation with said cavity resonator means and adapted for interchange of high frequency energy with external apparatus.

2. Apparatus as described in claim 1, wherein said recess means has a cylindrical conducting wall surrounding a substantial portion of said semiconductor diode means.

3. Apparatus as described in claim 2 wherein:
said cavity resonator means has an axis os symmetry,
said biasing circuit means, said semiconductor diode means, and said recessed surface means form a series high-frequency current path about said axis of symmetry, and
said biasing circuit means is supported in resistive relation with said cavity resonator.

4. Apparatus as described in claim 3 wherein:
said coupling means comprises a capacitive disk in energy exchanging relation with the oscillating electric field of said antiresonant mode electromagnetic field, and
a capacitive tuning means is placed opposite said capacitive disk in generally symmetric relation therewith.

* * * * *